United States Patent [19]

Mennucci

[11] Patent Number: 5,525,836
[45] Date of Patent: Jun. 11, 1996

[54] MULTILAYER METAL LEADFRAME

[75] Inventor: Joseph P. Mennucci, Manville, R.I.

[73] Assignee: Technical Materials, Inc., Lincoln, R.I.

[21] Appl. No.: 391,629

[22] Filed: Feb. 21, 1995

Related U.S. Application Data

[60] Continuation of Ser. No. 257,546, Jun. 9, 1994, abandoned, which is a division of Ser. No. 203,448, Feb. 28, 1994, Pat. No. 5,437,096.

[51] Int. Cl.⁶ .................................................. H01L 23/495
[52] U.S. Cl. .................... 257/748; 257/693; 257/695; 257/741; 257/762; 257/765; 257/771; 257/750; 257/666
[58] Field of Search ................................... 257/666, 703, 257/676, 762, 765, 741, 748, 750, 771, 690, 692, 693, 695, 736

[56] References Cited

U.S. PATENT DOCUMENTS

| | | | |
|---|---|---|---|
| 3,559,285 | 2/1971 | Kauffman | 29/630 |
| 4,480,262 | 10/1984 | Butt | 257/703 |
| 4,599,120 | 7/1986 | Churzh et al. | 148/414 |
| 4,761,518 | 8/1988 | Butt et al. | 257/703 |
| 5,014,113 | 5/1991 | Casto | 257/674 |
| 5,015,803 | 5/1993 | Mahnlikar et al. | 257/703 |
| 5,329,159 | 7/1994 | Lin | 257/666 |

FOREIGN PATENT DOCUMENTS

| | | |
|---|---|---|
| 0128981A3 | 12/1984 | European Pat. Off. . |
| 0205183A2 | 12/1986 | European Pat. Off. . |
| 62-208654 | 9/1987 | Japan . |

*Primary Examiner*—Robert P. Limanek
*Assistant Examiner*—Alexander Oscar Williams
*Attorney, Agent, or Firm*—Hopgood, Calimafde

[57] ABSTRACT

A leadframe for use in mounting and interconnecting an integrated circuit. A first or base metal layer of the leadframe comprises at least one of brass or other copper alloy. A second, conducting layer atop the base layer comprises at least one of aluminum or an aluminum alloy. A third, upper layer on the second layer comprises at least one of copper or a copper alloy. The first, second and third layers are formed into a multilayer clad strip, a portion of at least the third layer being selectively removed to expose a selected pattern of the second layer.

2 Claims, 2 Drawing Sheets

MULTILAYER METAL LEADFRAME

This application is a continuation of application Ser. No. 08/257,546, filed Jun. 9, 1994, now abandoned, which is a divisional of application Ser. No. 08/203,448, filed Feb. 28, 1994, now U.S. Pat. No. 5,437,096 issued Aug. 1, 1995.

TECHNICAL FIELD

The present invention relates generally to mounting and connecting integrated circuits and, more particularly, to an improved leadframe for making wire bond interconnects to hybrid electronic integrated circuits.

BACKGROUND OF THE INVENTION

The rapidly increasing use of computers and their associated integrated circuits in numerous applications has led to the corresponding increase in the use of leadframes for mounting and interconnecting these circuits for end use application. For example, the use of integrated circuit electronics in automobiles includes audio entertainment systems, air bag sensors and electronic control units.

Automobile engines are subjected to a harsh environment created by high temperature, corrosion, vibration and the like. To accommodate these conditions, and the need for compactness, considerable care must be taken to design and fabricate leadframes which mount electronic integrated circuits and allow for interconnections to be made reliably by a wire bonding operation between the circuit bond pads and external contacts and/or terminals.

Because of the many different integrated circuits that are used today, different designs and configurations for the leadframes must be provided. In one widely used method for fabricating these leadframes, a surface coat of aluminum is applied to a base metal such as brass. This coating, which is typically required in a selective area on an electric component, is produced by electroplating, cladding, welding or other known techniques.

The use of aluminum wire bonding to create the necessary interconnects for external components has become widespread, largely because aluminum is used in the bond pads and leadframes. In a conventional leadframe fabrication, the aluminum is placed into grooves patterned in a base made of brass or other copper alloy metal. The leadframe is then rolled and shaped to its desired thickness and width, after which the aluminum pattern is masked. The unit is then subjected to an electroplating process which deposits tin or tin-lead on all unmasked portions of the leadframe, that is, all portions except where the aluminum is present.

This art-recognized technique for making aluminum inlaid products is relatively expensive because specially designed leadframes and masking operations are required for unique product specifications. These special design features have interfered with the development of a generic or standardized leadframe which can be used for multiple applications, thereby permitting cost-reducing, volume-related manufacturing techniques.

In accordance with this background, a need exists for a versatile leadframe which can be used in different configurations for making wire bond interconnects to hybrid electronic integrated circuitry. There is also a need for a less costly fabrication process which allows a manufacturer to improve quality control and benefit from economies of scale.

SUMMARY OF THE INVENTION

The present invention provides a method for fabricating a leadframe which can be used as a generic or standard feedstock and then readily and inexpensively adapted at a late stage in its fabrication to any desired configuration for use as a multiple terminal leadframe. Typical finish gauges range from 25 to 32 mils depending on end-use application.

In the method of this invention, a multilayer laminate strip of a base metal and other conductive metals is formed by a cladding process. If desired, an additional metal layer may be electroplated onto the upper and lower surfaces of the clad strip. Portions of at least the upper layer are then selectively removed by conventional machining techniques including, but not limited to, rotary cutting or skiving to expose a selective pattern of the inner metal contact layer, which is preferably aluminum or alloys of aluminum. The exposed metal may be used as a contact surface to effect wire bonding. Interconnection may also be accomplished by known welding or soldering techniques.

These and other features, characteristics and advantages of the invention in general will be better understood from the following detailed description of an illustrative embodiment when considered in conjunction with the drawings described below.

DETAILED DESCRIPTION OF A PREFERRED EMBODIMENT

Figure 1:
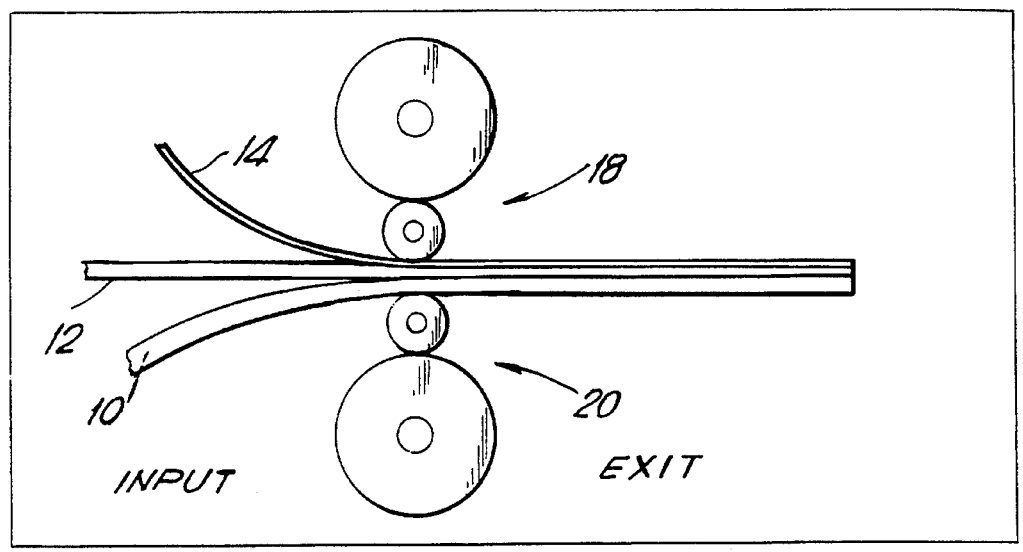
FIG. 1 is a schematic view of the cladding step used to form a multilayer clad strip as employed in the present invention.
Figure 2:
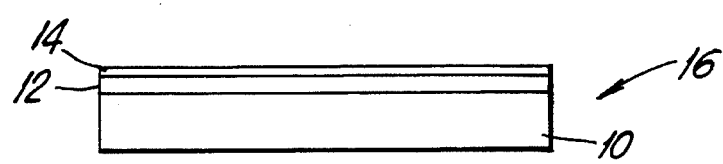
FIG. 2 is a side elevation of the clad strip formed by the step illustrated in FIG. 1.

As illustrated in FIG. 1, layers of a base metal such as brass or other alloy of copper 10, aluminum or aluminum alloys 12 and copper or copper alloy 14 are formed into a three-layer clad strip 16 (FIG. 2) by passing the three individual layers 10, 12, 14 between an opposing pair of rollers 18, 20 in a 4-H rolling mill or the like, which may be specifically modified for this purpose. The brass layer 10 may be, prior to cladding, 0.060 inches in thickness; aluminum-aluminum alloy layer 12 may be 0.018 inches in thickness and copper layer 14 may be 0.005 inches in thickness.

As in a conventional cladding operation, the thickness of the individual layers in clad strip 16 are typically reduced by about 65% after being subjected to the clad bonding process. As is known, this cladding process forms only a mechanical bond between the three layers. In order to create a stronger metallurgical bond between the layers, strip 16 may be subjected to a continuous annealing process at a temperature, speed and atmosphere that can be selected by those skilled in the art to achieve an optimum thickness (200 microinches maximum) of the diffusion or intermetallic layer so formed. In the preferred embodiments of this invention, the thickness of clad strip 16 ranges from 0.005 to 0.090 mils, with 0.015 to 0.040 mils most preferred.

Figure 3:
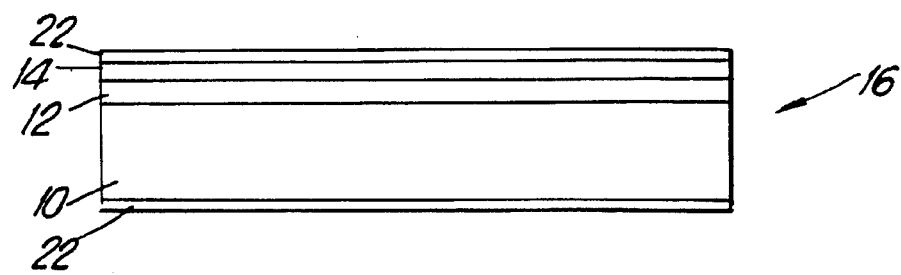
FIG. 3 is a side elevation similar to FIG. 2 of the clad strip following the electroplating step.

As shown in FIG. 3, coating 22 of tin or tin-lead is electrolytically deposited over the upper and lower surfaces of clad strip 16 by passing the strip through a continuous plating line. An underplate of copper may be formed in a conventional manner to improve the adherence of the Sn-Pb plating 22 to clad strip 16. The purpose of this coating is to environmentally protect the tabs forming the leads that extend beyond the plastic encapsulation of an integrated circuit, a design which is highly desirable when the leadframe is used for automotive applications.

A finish rolling operation is performed on the clad and plated strip, preferably by use of a 4-Hi rolling mill, to improve the thickness tolerance and add temper to the composite material, thereby increasing its strength. This rolling operation also benefits the plated surface by improving its finish.

Thereafter, the width of the strip material is trimmed back by removing the edges and passing the material between two rotating arbors (not shown in the drawings) which carry rotating cutting blades. This step removes rough edges and improves the width tolerance.

The clad and plated strip is then subjected to a levelling process by putting the material in tension as it passes through a set of deflection rolls (also not shown in the drawings) in a manner well known to those skilled in the art. This technique improves the straightness and flatness of the strip which enhances product quality by correcting shape and minimizing variation.

Figure 4:
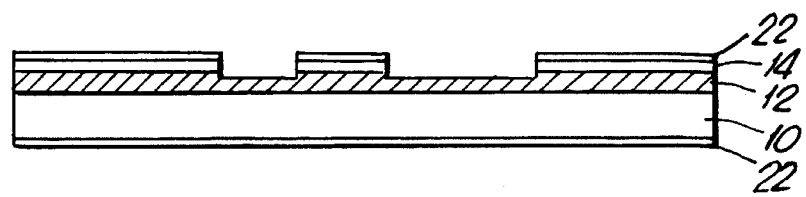
FIG. 4 is a side elevation of a multigauge leadframe formed in accordance with the present invention following a skiving step on the structure of FIG. 3.
Figure 5:
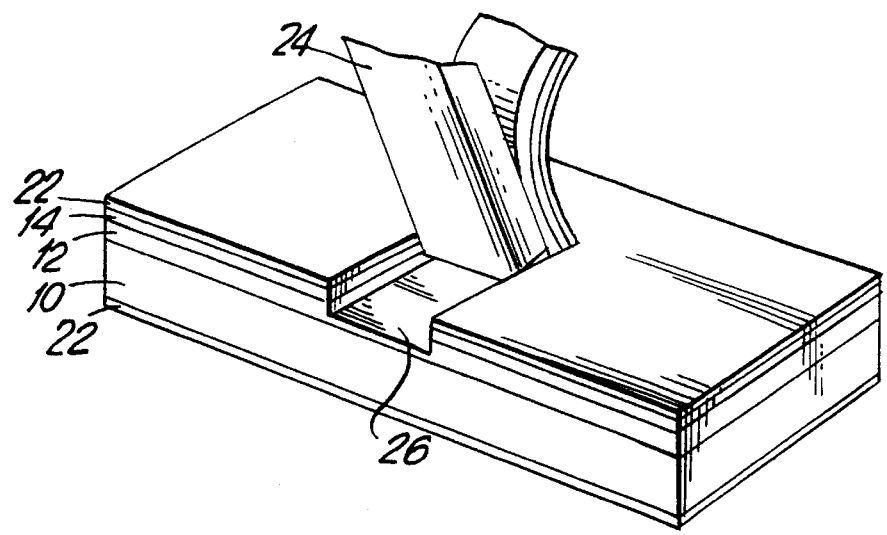
FIG. 5 is a perspective view schematically illustrating the skiving of the leadframe.

Then, as shown in FIGS. 4 and 5, in accordance with the invention, clad strip 16 is subjected to selective cutting in a multigauge skiving operation. During this operation, selective areas or portions of the surface overlying copper layer 14 and tin-lead layer 22 are removed to expose a selected pattern of inner aluminum layer 12 in accordance with the desired application and function of the finished leadframe. This selective removal of the upper metal layer is achieved by the use of a skive tool, stationary cutting blade 24 or other cutting or metal-removing techniques known to the art.

Figure 6:
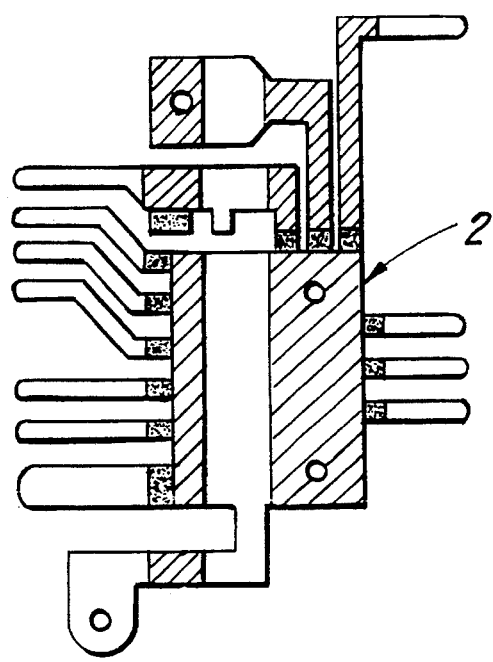
FIG. 6 is a plan view of a typical leadframe which can be fabricated according to this invention.

A guide fixture (not shown) incorporating the stationary cutting or skiving blade 24 is preferably used. This skiving step can be performed on any number of pre-selected areas to form the desired pattern of exposed aluminum without conventional masking techniques. As shown by FIG. 6, exposed aluminum layer 26 is available for contact with external connectors having diverse configurations.

Leadframe 30 comprises a housing 31 with a plurality of external male connectors or leads 31, extending from the housing in a generally radial fashion, for engaging female connectors (not shown) of wires leading to various electronic control components, for example, of a car. Applications of this leadframe include interfacing with hybrid integrated circuits for speed control, cruise control, engine control, anti-lock brakes and climate control. This unique leadframe/connector configuration, in conjuction with the superior electronic performance of the constituent multilayer laminate, provides a high degree of versatility to leadframe use without sacrificing performance or cost.

In an alternative embodiment, these art-recognized procedures are used to remove a portion of conducting layer 12 according to preselected patterns or configurations. For certain applications a planishing step is used to produce a smooth surface finish for conducting layer 12. Typical operations include rolling in a planishing mill or impacting the surface with highly polished dies or a hammer designed for this purpose.

Although a preferred embodiment has been described, various modifications and alterations to the present invention may be appreciated, including different metals for the various layers that comprise the clad strip. These changes and additions are intended to be within the scope and spirit of this invention as defined by the following claims.

What is claimed is:

1. A leadframe for use in mounting and interconnecting an integrated circuit, said leadframe comprising a first layer of at least one of brass or other copper alloy, a second layer on the first layer comprising at least one of aluminum or an aluminum alloy, and a third layer atop the second layer comprising at least one of copper or a copper alloy, the first, second and third layers being formed into a multilayer clad strip, a portion of at least said third layer being selectively removed to expose a selected pattern of said second layer.

2. A leadframe for use in mounting and interconnecting an integrated circuit, said leadframe comprising:

a housing having a plurality of external male connectors radially disposed therefrom, the connectors being oriented and configured for connection to the integrated circuit, the housing comprising a first layer of at least one of brass or other copper alloy, a second layer on the first layer being of at least one of aluminum or an aluminum alloy, and a third layer atop the second comprising at least one of copper or a copper alloy, the first, second and third layers being formed into a multilayer clad strip, a portion of at least said third layer being selectively removed to expose a selected pattern of said second layer.

\* \* \* \* \*